US009471079B2

(12) United States Patent
Chang

(10) Patent No.: US 9,471,079 B2
(45) Date of Patent: Oct. 18, 2016

(54) METHOD WITH FUNCTION PARAMETER SETTING AND INTEGRATED CIRCUIT USING THE SAME

(71) Applicant: uPI Semiconductor Corp., Hsinchu County (TW)

(72) Inventor: Chih-Lien Chang, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 14/631,853

(22) Filed: Feb. 26, 2015

(65) Prior Publication Data

US 2016/0109894 A1 Apr. 21, 2016

(30) Foreign Application Priority Data

Oct. 16, 2014 (TW) ............................ 103135830 A

(51) Int. Cl.
*H03K 5/153* (2006.01)
*G05F 1/625* (2006.01)

(52) U.S. Cl.
CPC .................................... *G05F 1/625* (2013.01)

(58) Field of Classification Search
CPC ............ H03K 3/2893; H03K 3/3565; H03K 3/02337; H03K 3/0377; H03K 3/011
USPC .......................................... 327/77, 205, 206
See application file for complete search history.

(56) References Cited

U.S. PATENT DOCUMENTS 4,527,076 A * 7/1985 Matsuo et al. .................. 327/88
6,204,892 B1 * 3/2001 Kawano ........................ 348/691
6,554,469 B1 * 4/2003 Thomson ................. G01K 7/01 327/512
6,566,905 B2 5/2003 Sanzo et al.
7,661,051 B2 * 2/2010 Singh ................. G01R 31/3191 326/30
8,183,849 B2 * 5/2012 Wu .......................... H03F 1/30 323/314
8,552,766 B2 * 10/2013 Stracquadaini ................. 327/75
2005/0206422 A1 * 9/2005 Mehas et al. ................. 327/205
2010/0060083 A1 * 3/2010 Rolland .................. G06F 1/263 307/80
2011/0018587 A1 1/2011 Li
2012/0146709 A1 * 6/2012 Jessenig ................ G01K 3/005 327/512

FOREIGN PATENT DOCUMENTS

TW M417600 12/2011

* cited by examiner

*Primary Examiner* — Quan Tra
(74) *Attorney, Agent, or Firm* — Jianq Chyun IP Office

(57) ABSTRACT

A method with function parameter setting and an integrated circuit using the same are provided. The integrated circuit includes a function pin coupled to an external setting unit, a switch unit, and first and second function adjustment circuits. The first function adjustment circuit includes first and second current sources. The second function adjustment circuit detects a percentage of a divided voltage at the function pin, to provide a reference value and to set a second function parameter. The first function adjustment circuit uses the first current source to detect a first voltage detecting value at the function pin, and compares the first voltage detecting value with a default value. The switch unit switches the first and second current sources according to a compare result. The present invention adopts an integrated circuit for switching a plurality of current sources and detections, and may determine more resistance value setting intervals.

10 Claims, 5 Drawing Sheets

METHOD WITH FUNCTION PARAMETER SETTING AND INTEGRATED CIRCUIT USING THE SAME

CROSS-REFERENCE TO RELATED APPLICATION

This application claims the priority benefit of Taiwan application serial no. 103135830, filed on Oct. 16, 2014. The entirety of the above-mentioned patent application is hereby incorporated by reference herein and made a part of this specification.

BACKGROUND

1. Field of the Invention

The invention relates to a technique for function parameter setting, and particularly relates to a method with function parameter setting and an integrated circuit using the same.

2. Description of Related Art

When an integrated circuit (IC) is activated, the hardware connected to a function pin of the IC is generally used to obtain an initial setting value. For example, in a commonly used voltage-dividing setting method, at least two resistors are used to set the initial setting value in a voltage-dividing manner. The IC detects a percentage of a divided voltage through the function pin, so as to obtain the setting value.

Another conventional technique is a parallel resistance setting method, and in the parallel resistance setting method, a constant detecting current flows to or flows out from the function pin to form a voltage detecting value at the function pin, so as to detect setting intervals of parallel resistance values. A detection accuracy of the voltage-dividing setting method on the setting intervals is generally higher than that of the parallel resistance setting method. However, if the parallel resistance setting method is used for detecting the resistance value setting intervals, some resistance value setting intervals for the voltage-dividing setting method are sacrificed. If the two setting methods are used in the conventional technique, some resistance value setting intervals have to be sacrificed.

Moreover, the detecting current used in the parallel resistance setting method is confined within a specific range, and a comparator adopted for the detection also has a corresponding deviation value and other design error factors. Considering a design security, the greater the parallel resistance value of the setting interval is, the larger difference of the parallel resistance setting values of the two adjacent setting intervals is. Therefore, a range of the setting interval that can be used by the parallel resistance setting method of the convention technique is limited.

Moreover, a special example of a degradation circuit in the parallel resistance setting method is that the function pin is connected to one end of a resistor, and another end of the resistor is connected to the ground or a power supply.

SUMMARY

The invention is directed to a method with function parameter setting and an integrated circuit using the same, so as to resolve the problem mentioned in the related art.

The invention provides an integrated circuit with function parameter setting, which is coupled to an external setting unit. The integrated circuit includes a function pin, a switch unit and a function adjustment circuit. The function pin is coupled to the external setting unit. The switch unit is coupled to the function pin. The function adjustment circuit is coupled to the switch unit. The function adjustment circuit includes a first current source and a second current source. The first current source and the second current source are respectively coupled to the switch unit. The function adjustment circuit detects a first voltage detecting value at the function pin by using the first current source, and compares the first voltage detecting value with a default value. The switch unit switches the first current source and the second current source according to a comparison result.

In an embodiment of the invention, the function adjustment circuit further includes a control unit. The control unit generates the comparison result according to the first voltage detecting value and the default value. When the comparison result indicates that the first voltage detecting value is smaller than the default value, the control unit controls the switch unit to turn on a path between the first current source and the external setting unit; and when the first voltage detecting value is greater than the default value, the control unit controls the switch unit to turn on a path between the second current source and the external setting unit.

In an embodiment of the invention, the function adjustment circuit further includes a first logic unit and a second logic unit. The first logic unit has a plurality of comparators of a first group, and the second logic unit has at least one comparator of a second group. When the first voltage detecting value is smaller than the default value, the control unit activates the first logic unit, and the first logic unit determines a resistance value setting interval corresponding to the external setting unit according to the first voltage detecting value and sets a function parameter. When the first voltage detecting value is greater than the default value, the control unit activates the second logic unit, and the function adjustment circuit uses the second current source to detect a second voltage detecting value at the function pin, and the second logic unit determines the resistance value setting interval corresponding to the external setting unit according to the second voltage detecting value and sets the function parameter.

In an embodiment of the invention, a current value of the first current source is greater than a current value of the second current source.

The invention provides an integrated circuit with function parameter setting, which is coupled to an external setting unit. The integrated circuit includes a function pin, a switch unit, a first function adjustment circuit and a second function adjustment circuit. The function pin is coupled to the external setting unit. The switch unit is coupled to the function pin. The first function adjustment circuit is coupled to the switch unit and receives a reference value. The first function adjustment circuit includes a first current source and a second current source. The first current source and the second current source are respectively coupled to the switch unit. The second function adjustment circuit is coupled to the switch unit. The second function adjustment circuit detects a percentage of a divided voltage at the function pin, so as to provide the reference value and set a second function parameter. The first function adjustment circuit uses the first current source to detect a first voltage detecting value at the function pin, and compares the first voltage detecting value with a default value to generate a comparison result, and controls the switch unit to switch the first current source and the second current source according to the comparison result, and sets a first function parameter.

In an embodiment of the invention, the first function adjustment circuit further includes a control unit. The control unit generates the comparison result according to the first voltage detecting value and the default value. When the comparison result indicates that the first voltage detecting value is smaller than the default value, the control unit controls the switch unit to turn on a path between the first current source and the external setting unit; and when the first voltage detecting value is greater than the default value, the control unit controls the switch unit to turn on a path between the second current source and the external setting unit.

In an embodiment of the invention, the first function adjustment circuit further includes a first logic unit and a second logic unit. The first logic unit has a plurality of comparators of a first group, and the second logic unit has at least one comparator of a second group. When the first voltage detecting value is smaller than the default value, the control unit activates the first logic unit, and the first logic unit determines a resistance value setting interval corresponding to the external setting unit according to the first voltage detecting value and the reference value and sets a first function parameter. When the first voltage detecting value is greater than the default value, the control unit activates the second logic unit, and the first function adjustment circuit uses the second current source to detect a second voltage detecting value at the function pin, and the second logic unit determines the resistance value setting interval corresponding to the external setting unit according to the second voltage detecting value and the reference value and sets the first function parameter.

In an embodiment of the invention, the switch unit turns off paths between the first current source and the second current source and the external setting unit, and the second function adjustment circuit sets the second function parameter.

The invention provides a method with function parameter setting adapted to an integrated circuit. The integrated circuit has a function pin. The function pin is coupled to an external setting unit and a switch unit. The method includes following steps. A function adjustment circuit is provided, wherein the function adjustment circuit includes a first current source and a second current source respectively coupled to the switch unit. The first current source is made to flow into or flow out of the external setting unit through the function pin. The function adjustment circuit is used to detect a first voltage detecting value at the function pin. A comparison result is generated according to the first voltage detecting value and a default value. The switch unit is controlled to switch the first current source and the second current source according to the comparison result.

In an embodiment of the invention, the method with function parameter setting further includes following steps. When the comparison result indicates that the first voltage detecting value is smaller than the default value, the switch unit is controlled to turn on a path between the first current source, the function pin and the external setting unit; and when the first voltage detecting value is greater than the default value, the switch unit is controlled to turn on a path between the second current source, the function pin and the external setting unit.

In an embodiment of the invention, the function adjustment circuit further includes a first logic unit and a second logic unit. The method further includes following steps. When the first voltage detecting value is smaller than the default value, the first logic unit is activated, and the first logic unit determines a resistance value setting interval corresponding to the external setting unit according to the first voltage detecting value and sets a function parameter. When the first voltage detecting value is greater than the default value, the second logic unit is activated, and the second current source is made to flow into or flow out of the external setting unit through the function pin, and a second voltage detecting value at the function pin is detected, and the second logic unit determines the resistance value setting interval corresponding to the external setting unit according to the second voltage detecting value and sets the function parameter.

The invention provides a method with function parameter setting adapted to an integrated circuit. The integrated circuit has a function pin. The function pin is coupled to an external setting unit and a switch unit. The method with function parameter setting includes following steps. A first function adjustment circuit and a second function adjustment circuit respectively coupled to the switch unit are provided, wherein the first function adjustment circuit includes a first current source and a second current source. The second function adjustment circuit is used to detect a percentage of a divided voltage at the function pin, so as to provide a reference value to the first function adjustment circuit and set a second function parameter. The first current source is made to flow into or flow out of the external setting unit through the function pin. The first function adjustment circuit is used to detect a first voltage detecting value of the external setting unit. A comparison result is generated according to the first voltage detecting value and a default value. The switch unit is controlled to switch the first current source and the second current source according to the comparison result.

In an embodiment of the invention, the method with function parameter setting further includes following steps. When the comparison result indicates that the first voltage detecting value is smaller than the default value, the switch unit is controlled to turn on a path between the first current source, the function pin and the external setting unit; and when the first voltage detecting value is greater than the default value, the switch unit is controlled to turn on a path between the second current source, the function pin and the external setting unit.

In an embodiment of the invention, the function adjustment circuit further includes a first logic unit and a second logic unit. The method further includes following steps. When the first voltage detecting value is smaller than the default value, the first logic unit is activated, and the first logic unit determines a resistance value setting interval corresponding to the external setting unit according to the first voltage detecting value and the reference value and sets a first function parameter. When the first voltage detecting value is greater than the default value, the second logic unit is activated, and the second current source is made to flow into or flow out of the external setting unit through the function pin, and a second voltage detecting value at the function pin is detected, and the second logic unit determines the resistance value setting interval corresponding to the external setting unit according to the second voltage detecting value and the reference value and sets the first function parameter.

According to the above descriptions, according to the method with function parameter setting and the integrated circuit using the same of the invention, the integrated circuit capable of switching a plurality of current sources and detections is adopted to expand a range of the resistance value setting intervals. Compared to the conventional technique, in the invention, when the parallel resistance setting method is used, more resistance value setting intervals can be detected, such that the range of the applicable resistance values is expanded. On the other hand, the integrated circuit of the invention can implement setting of multiple function parameters at the same function pin, such that detection accuracy is maintained when the voltage-dividing setting method is executed, and it is avoided to sacrifice some resistance value setting intervals for the voltage-dividing setting method when the parallel setting method is executed, and both advantages of the two setting methods are achieved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
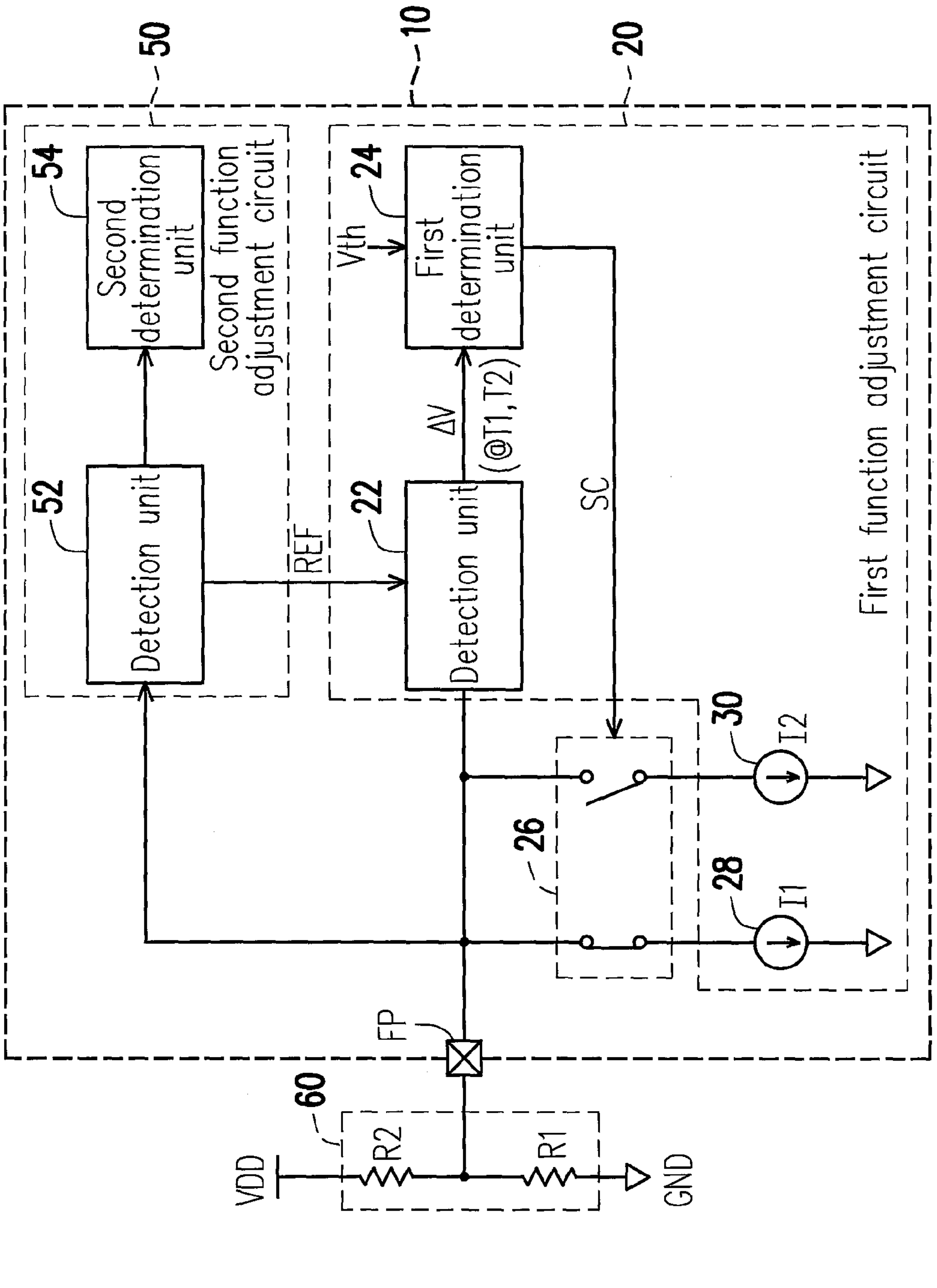
FIG. 1 is a circuit diagram of an integrated circuit (IC) according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, when "A" device is referred to be "electrically connected" to "B" device, the "A" device can be directly connected or coupled to the "B" device, or other devices probably exist there between, or the two devices can communicated with each other through an electric signal. A term "circuit" or "unit" can represent at least one device or a plurality of devices or devices actively and/or passively coupled to each other to provide a suitable function. A term "signal" can represent at least one current, voltage, load, temperature, data or other signal.

Reference will now be made in detail to the embodiments of the invention, examples of which are illustrated in the accompanying drawings. Wherever possible, the same reference numbers are used in the drawings and the description to refer to the same or like parts.

FIG. 1 is a circuit diagram of an integrated circuit (IC) according to an embodiment of the invention. Referring to FIG. 1, the IC 10 is coupled to an external setting unit 60. The external setting unit 60 may include resistors R1 and R2, where the resistors R1 and R2 coupled in series are connected between a working voltage VDD and the ground GND, though the number and coupling method of the resistors are not limited thereto. The IC 10 includes a function pin FP coupled to the external setting unit 60, a switch unit 26, a first function adjustment circuit 20 and a second function adjustment circuit 50. Moreover, in the external setting unit 60, two resistors are illustrated, though the external setting unit 60 may also include other impedance elements.

The first function adjustment circuit 20 and the second function adjustment circuit 50 are coupled to the switch unit 26. The first function adjustment circuit 20 includes a first current source 28 and a second current source 30. The first current source 28 and the second current source 30 are respectively coupled to the switch unit 26. The second function adjustment circuit 50 includes a detection unit 52 and a second determination unit 54.

Moreover, although the switch unit 26 is configured between the function pin FP, the first current source 28 and the second current source 30 as that shown in FIG. 1, the switch unit 26 can also be configured between the first current source 28, the second current source 30 and the ground GND.

When the IC 10 is activated, the second function adjustment circuit 50 can execute a voltage-dividing setting method first to obtain an initial setting value. The detection unit 52 of the second function adjustment circuit 50 detects a divided voltage at the function pin FP, where the divided voltage is (R1×(R1+R2))×VDD, so as to provide a reference value REF with a percentage (R1×(R1+R2))×100% of the divided voltage to the second function adjustment circuit 50, and the second determination unit 54 can set a second function parameter according to the above detection result.

The second function adjustment circuit 50 can directly control the switch unit 26, or indirectly control the switch unit 26 through the first function adjustment circuit 20 or other circuit to turn off a path between the first current source 28 and the external setting unit 60 or between the second current source 30 and the external setting unit 60, and the second function adjustment circuit 50 is used to set the second function parameter.

The IC 10 can set a plurality of function parameters by using the same function pin FP, and besides executing the voltage-dividing setting method to maintain detection accuracy, the first function adjustment circuit 20 can be used to execute a parallel setting method as follows. The path between the first current source 28 and the external setting unit 60 is turned on, a detection unit 22 of the first function adjustment circuit 20 detects a voltage detecting value ΔV at the function pin FP (in a first time period T1, ΔV=I1×(R1×R2)/(R1+R2)), and a first determination unit 24 compares the voltage detecting value ΔV (in the first time period T1) with a default value Vth. The switch unit 26 determines whether to switch the first current source 28 and the second current source 30 according to a comparison result SC of the first determination unit 24.

Figure 2:
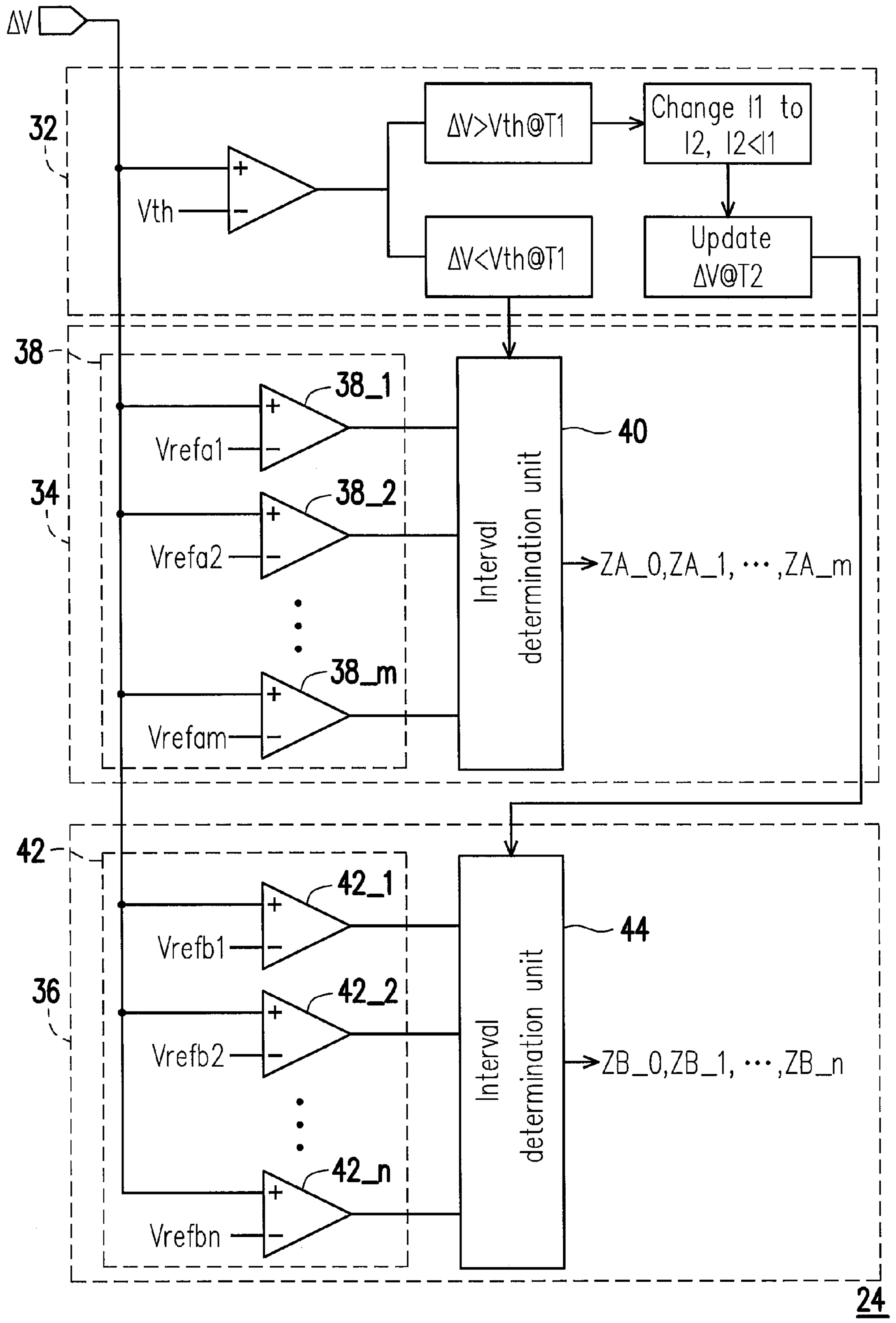
FIG. 2 is a circuit schematic diagram of a first determination unit according to an embodiment of the invention.

In detail, the aforementioned parallel setting method is described in detail below with reference of FIG. 2. FIG. 2 is a circuit schematic diagram of the first determination unit 24 according to an embodiment of the invention. Referring to FIG. 1 and FIG. 2, the first determination unit 24 of the first function adjustment circuit 20 further includes a control unit 32. The control unit 32 generates the comparison result SC according to the voltage detecting value ΔV (in the first time period T1, ΔV=I1×(R1×R2)/(R1+R2)) and the default value Vth. When the comparison result SC indicates that the voltage detecting value ΔV is smaller than the default value Vth, the control unit 32 controls the switch unit 26 to turn on the path between the first current source 28 and the external setting unit 60; and when the voltage detecting value ΔV is greater than the default value Vth, the control unit 32 controls the switch unit 26 to turn on the path between the second current source 30 and the external setting unit 60.

The first determination unit 24 further includes a first logic unit 34 and a second logic unit 36. The first logic unit 34 has a plurality of comparators 38 of a first group (the comparator 38 may include 38_1, 38_2, . . . , 38_*m*) and an interval determination unit 40. The second logic unit 36 has at least one comparator 42 of a second group (the comparator 42 may include 42_1, or the comparator 42 may include 42_1, 42_2, . . . , 42_*n*) and an interval determination unit 44.

When the voltage detecting value ΔV is smaller than the default value Vth (in the first time period T1), the control unit 32 activates the first logic unit 34, and the comparators 38 of the first group compare the voltage detecting value ΔV (in the first time period T1) with a first group reference voltages Vrefa1, Vrefa2, . . . , Vrefam, and the interval determination unit 40 determines a resistance value setting interval corresponding to the external setting unit 60 according to the comparison results of the comparators 38 of the first group and the reference value REF, so as to determine one of the resistance value setting intervals ZA_0, ZA_1, . . . , ZA_m, and further sets a first function parameter.

On the other hand, when the voltage detecting value ΔV (in the first time period T1) is greater than the default value Vth, the control unit 32 activates the second logic unit 36, and the first function adjustment circuit 20 uses the second current source 30 to detect a voltage detecting value ΔV (in a second time period T2, ΔV=I2×(R1×R2)/(R1+R2)) at the function pin FP. A current value I2 of the second current source 30 is smaller than a current value I1 of the first current source 28 (for example, I2 is 20 μA, I1 is 50 μA). The at least one comparator 42 of the second group compares the updated voltage detecting value ΔV (in the second time period T2) with a second group reference voltages Vrefb1, Vrefb2, . . . , Vrefbn, and the interval determination unit 44 determines the resistance value setting interval corresponding to the external setting unit 60 according to the comparison results of the at least one comparator 42 of the second group and the reference value REF, so as to determine one of the resistance value setting intervals ZB_0, ZB_1, . . . , ZB_n, and further sets the first function parameter.

For example, there are five resistance value setting intervals ZA_0, ZA_1, ZA_2, ZB_0, ZB_1, which are respectively used for determining whether the parallel resistance value of the resistors R1 and R2 is within setting intervals of 2K ohm, 6K ohm, 18K ohm, 30K ohm, 50K ohm. It is assumed that the current value I1 is 50 μA, the current value I2 is 20 μA, and the default value Vth is 1 volt. It is assumed that the parallel resistance value of the external setting unit 60 is 50K ohm, which is unknown by the IC 10 before determination. When the first current source 28 is turned on, the voltage detecting value ΔV (ΔV=50K×50 μA=2.5 volt) is greater than the default value Vth. Then, the first current source 28 is turned off, and the second current source 30 is turned on to decrease the voltage detecting value ΔV, and the control unit 32 activates the second logic unit 36, where the updated voltage detecting value ΔV is ΔV=50K×20 μA=1 volt, and the second logic unit 36 determines that the external setting unit 60 is in the resistance value setting interval ZB_1. Therefore, when the first current source 28 is used for determination, it is determined that the range of the resistance value is within the interval of 2K to 18K (ZA_0, ZA_1, ZA_2), and when the first current source 28 and the second current source 30 are used for determination, it is determined that the range of the resistance value is within the interval of 2K to 50K (ZA_0, ZA_1, ZA_2, ZB_0, ZB_1), so that the present embodiment can expand the range of at least two resistance value setting intervals. Moreover, the number of the intervals and the magnitude of the resistance value can be determined according to a design requirement, which is not limited by the invention.

The integrated circuit capable of switching a plurality of current sources and detections is adopted to expand a range of the resistance value setting intervals. Compared to the conventional technique, in the invention, when the parallel resistance setting method is used, more resistance value setting intervals can be detected (for example, the resistance value setting intervals ZB_0, ZB_1, . . . , ZB_n are added), such that the range of the applicable resistance values is expanded. Therefore, the IC 10 can implement setting of multiple function parameters at the same function pin FP, such that detection accuracy is maintained when the voltage-dividing setting method is executed, and it is avoided to sacrifice some resistance value setting intervals for the voltage-dividing setting method when the parallel setting method is executed, and both advantages of the two setting methods are achieved.

Figure 3:
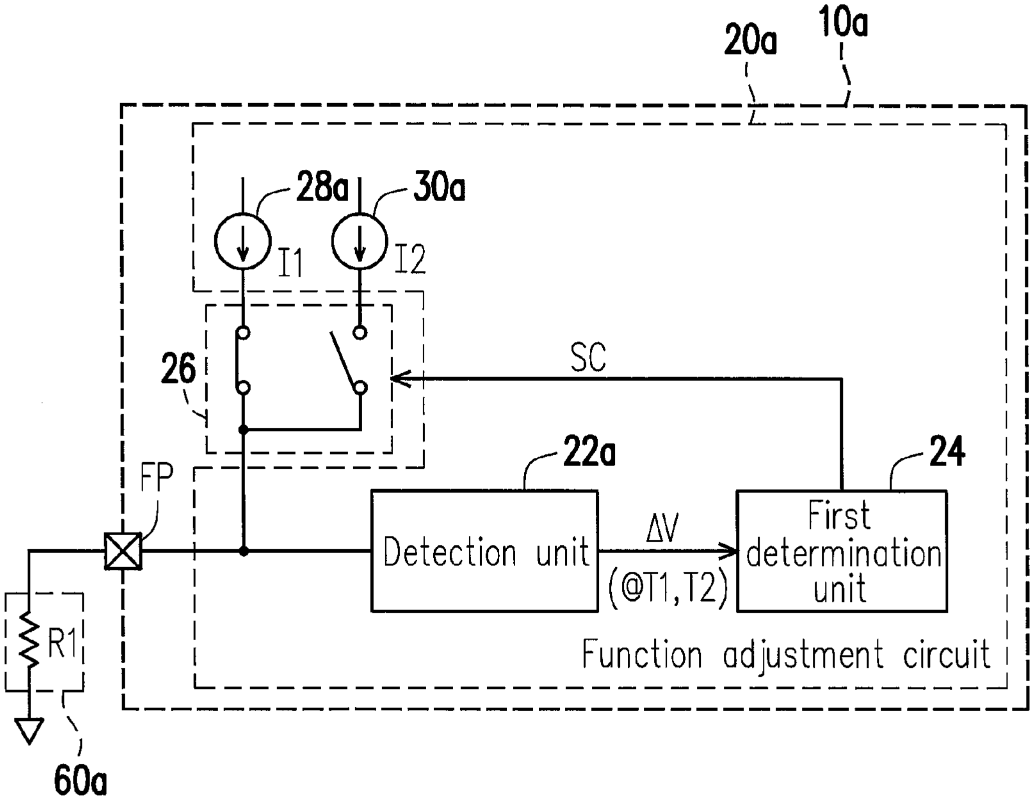
FIG. 3 is a circuit diagram of an IC according to another embodiment of the invention.

FIG. 3 is a circuit diagram of an IC according to another embodiment of the invention. Referring to FIG. 3, the IC 10*a* is coupled to an external setting unit 60*a*. The external setting unit 60*a* includes a resistor R1. The IC 10*a* includes the function pin FP coupled to the external setting unit 60*a*, the switch unit 26, a function adjustment circuit 20*a*. The function pin FP is coupled to the external setting unit 60*a*. The switch unit 26 is coupled to the function pin FP. The function adjustment circuit 20*a* is coupled to the switch unit 26. The function adjustment circuit 20*a* includes a first current source 28*a* and a second current source 30*a*. The first current source 28*a* and the second current source 30*a* are respectively coupled to the switch unit 26. The function adjustment circuit 20*a* detects a voltage detecting value ΔV (in the first time period T1, ΔV=I1×R1) at the function pin FP by using the first current source 28*a*, and compares the voltage detecting value ΔV (in the first time period T1) with the default value Vth. The switch unit 26 switches the first current source and the second current source according to the comparison result SC. Working principles of a detection unit 22*a* and the first determination unit 24 in the function adjustment circuit 20*a* can refer related description of FIG. 2, which are not repeated.

A special example of a degradation circuit in the parallel resistance setting method is as shown in the embodiment of FIG. 3, in which the function pin FP is only connected to one resistor, and by switching the first current source 28*a* and the second current source 30*a* and based on operations of the detection unit 22*a* and the first determination unit 24, the embodiment of FIG. 3 can expand the range of the resistance value setting intervals as that does of the embodiment of FIG. 1. Compared to the conventional technique, when the parallel resistance setting method is executed in the embodiment of FIG. 3, more resistance value setting intervals can be detected (for example, the resistance value setting intervals ZB_0, ZB_1, . . . , ZB_n are added), such that the range of the applicable resistance values is expanded.

Figure 4:
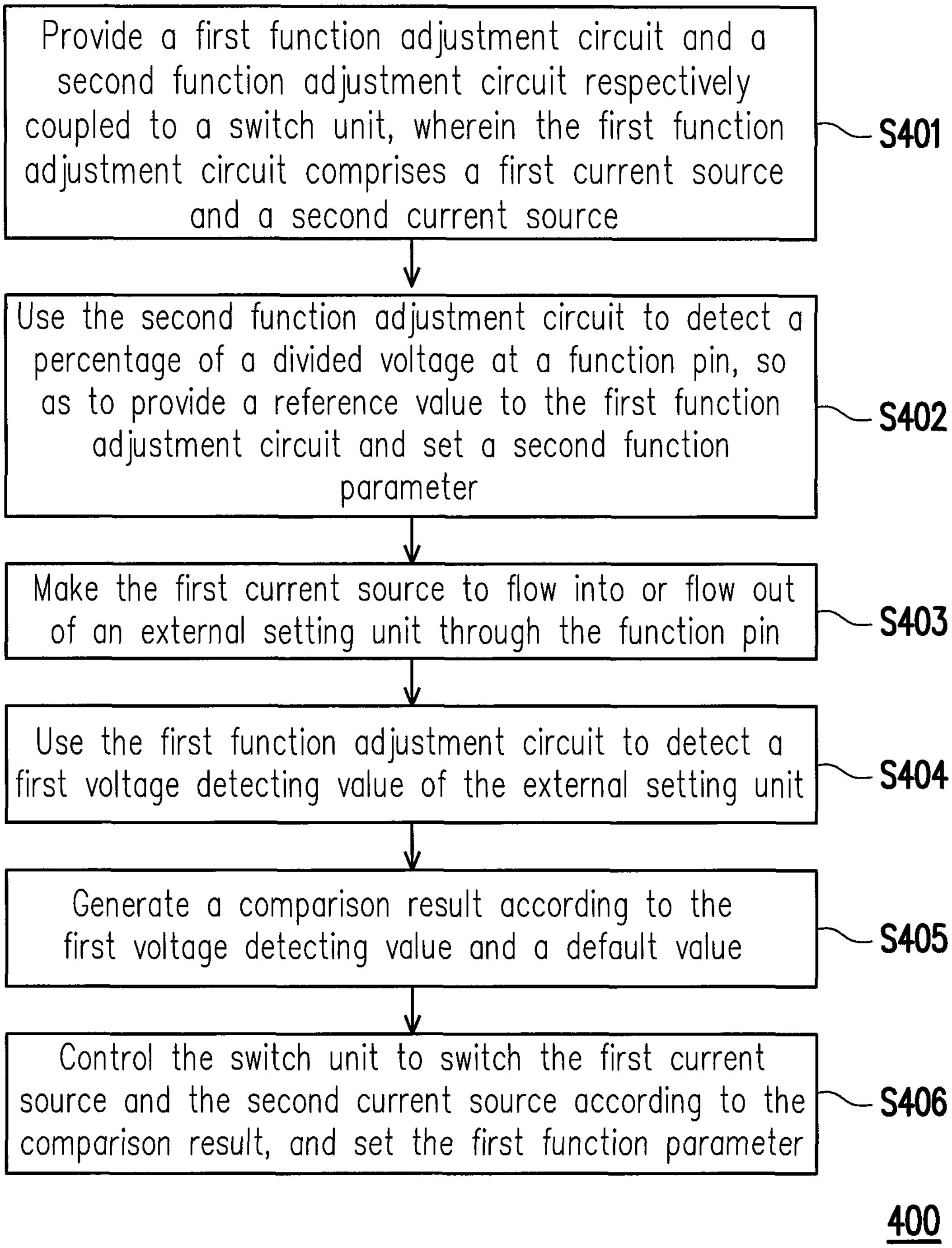
FIG. 4 is a flowchart illustrating a method with function parameter setting according to an embodiment of the invention.

According to the disclosure of the above embodiment, a general method with function parameter setting can be deduced. In detail, FIG. 4 is a flowchart illustrating a method with function parameter setting according to an embodiment of the invention. Referring to FIG. 1, FIG. 2 and FIG. 4, the method with function parameter setting 400 of the present embodiment is adapted to the IC 10 having the function pin FP. The function pin FP is coupled to the external setting unit 60 and the switch unit 26. The method with function parameter setting 400 may include following steps.

In step S401, the first function adjustment circuit 20 and the second function adjustment circuit 50 respectively coupled to the switch unit 26 are provided, where the first function adjustment circuit 20 includes the first current source 28 and the second current source 30. The current value I1 of the first current source 28 is greater than the current value I2 of the second current source 30.

In step S402, the second function adjustment circuit 50 is used to detect a percentage of a divided voltage at the function pin FP, so as to provide the reference value REF to the first function adjustment circuit 20 and set a second function parameter.

In step S403, the first current source 28 is made to flow out of the external setting unit 60 through the function pin FP. Moreover, the current of the first current source 28 can also be configured to flow into the external setting unit 60, which is not limited by the invention.

In step S404, in the first time period T1, the first function adjustment circuit 20 is used to detect a first voltage detecting value (ΔV@T1) of the external setting unit 60.

In step S405, the comparison result SC is generated according to the first voltage detecting value and the default value Vth.

In step S406, the switch unit 26 is controlled to switch the first current source 28 and the second current source 30 according to the comparison result SC, and the first function parameter is set. When the comparison result SC indicates that the first voltage detecting value is smaller than the default value Vth, the switch unit 26 is controlled to turn on a path between the first current source 28, the function pin FP and the external setting unit 60. When the first voltage detecting value is greater than the default value Vth, the switch unit 26 is controlled to turn on the path between the second current source 30, the function pin FP and the external setting unit 60.

Moreover, the first function adjustment circuit 20 further includes the first logic unit 34 and the second logic unit 36. The method 400 further includes following steps. When the first voltage detecting value is smaller than the default value Vth, the first logic unit 34 is activated, and the first logic unit 34 determines one of a plurality of the resistance value setting intervals ZA_0, ZA_1, . . . , ZA_m corresponding to the external setting unit 60 according to the first voltage detecting value and the reference value REF, and sets the first function parameter. In the second time period T2, when the first voltage detecting value is greater than the default value Vth, the second logic unit 36 is activated, and the second current source 30 is made to flow into or flow out of the external setting unit 60 through the function pin FP, a second voltage detecting value (ΔV@T2) at the function pin FP is detected, and the second logic unit 36 determines one of a plurality of the resistance value setting intervals ZB_0, ZB_1, . . . , ZB_n corresponding to the external setting unit 60 according to the second voltage detecting value and the reference value REF, and sets the first function parameter.

Figure 5:
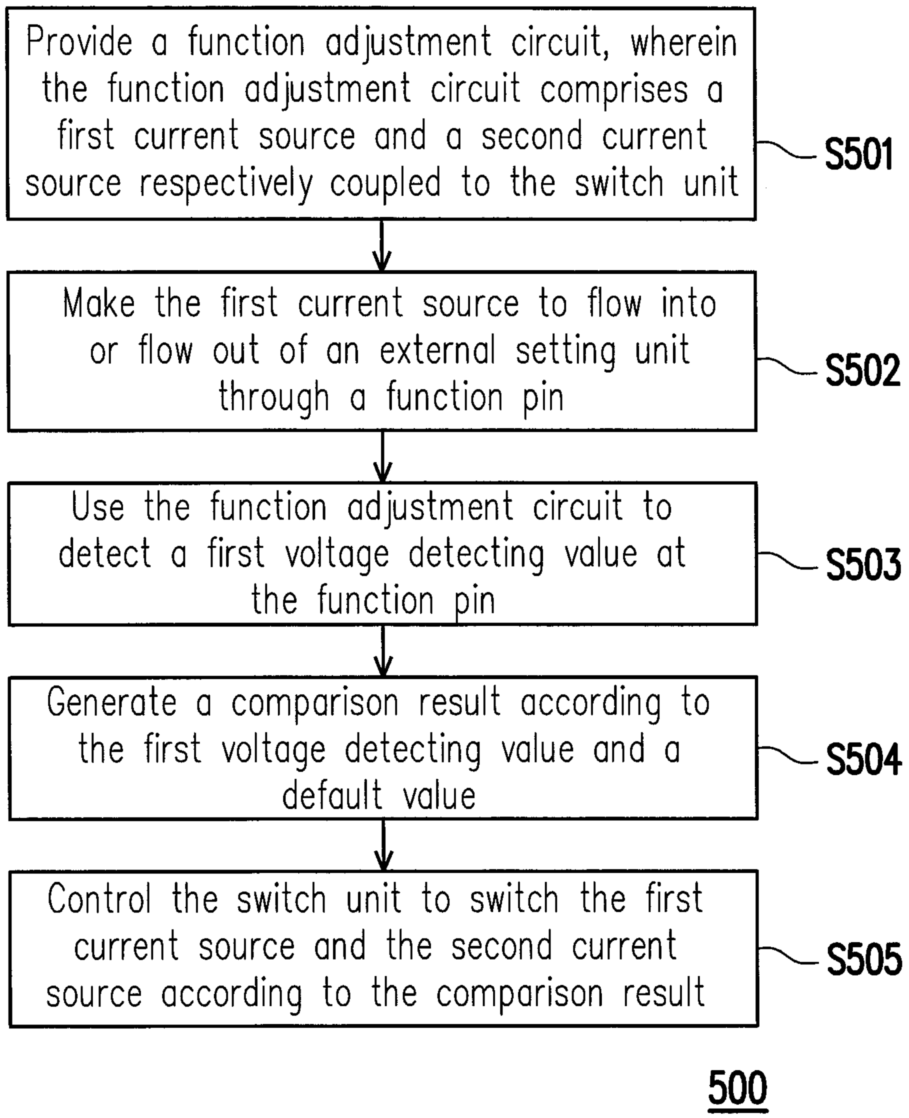
FIG. 5 is a flowchart illustrating a method with function parameter setting according to another embodiment of the invention.

According to the disclosure of the above embodiment, another method with function parameter setting can be deduced, which is adapted to the parallel resistance setting method of a degradation type. In detail, FIG. 5 is a flowchart illustrating a method with function parameter setting according to another embodiment of the invention. Referring to FIG. 2, FIG. 3 and FIG. 5, the method with function parameter setting 500 of the present embodiment is adapted to the IC 10*a* having the function pin FP. The function pin FP is coupled to the external setting unit 60*a*. The method with function parameter setting 500 may include following steps.

In step S501, the function adjustment circuit 20*a* is provided, where the function adjustment circuit 20*a* includes the first current source 28*a* and the second current source 30*a* respectively coupled to the switch unit 26. The current value I1 of the first current source 28*a* is greater than the current value I2 of the second current source 30*a*.

In step S502, the first current source 28*a* is made to flow into the external setting unit 60*a* through the function pin FP. Moreover, the current of the first current source 28*a* can also be configured to flow out of the external setting unit 60*a*, which is not limited by the invention.

In step S503, in the first time period T1, the function adjustment circuit 20*a* is used to detect a first voltage detecting value (ΔV@T1) at the function pin FP.

In step S504, the comparison result SC is generated according to the first voltage detecting value and the default value Vth.

In step S505, the switch unit 26 is controlled to switch the first current source 28*a* and the second current source 30*a* according to the comparison result SC. When the comparison result SC indicates that the first voltage detecting value is smaller than the default value Vth, the switch unit 26 is controlled to turn on the path between the first current source 28*a*, the function pin FP and the external setting unit 60*a*. When the first voltage detecting value is greater than the default value Vth, the switch unit 26 is controlled to turn on the path between the second current source 30, the function pin FP and the external setting unit 60*a*.

Moreover, the function adjustment circuit 20*a* further includes the first logic unit 34 and the second logic unit 36. The method 500 further includes following steps. When the first voltage detecting value is smaller than the default value Vth, the first logic unit 34 is activated, and the first logic unit 34 determines one of a plurality of the resistance value setting intervals ZA_0, ZA_1, . . . , ZA_m corresponding to the external setting unit 60*a* according to the first voltage detecting value, and sets the first function parameter. In the second time period T2, when the first voltage detecting value is greater than the default value Vth, the second logic unit 36 is activated, and the second current source 30*a* is made to flow into or flow out of the external setting unit 60*a* through the function pin FP, the second voltage detecting value (ΔV@T2) at the function pin FP is detected, and the second logic unit 36 determines one of a plurality of the resistance value setting intervals ZB_0, ZB_1, . . . , ZB_n corresponding to the external setting unit 60*a* according to the second voltage detecting value, and sets the first function parameter.

In summary, according to the method with function parameter setting and the integrated circuit using the same of the invention, the integrated circuit capable of switching a plurality of current sources and detections is adopted to expand a range of the resistance value setting intervals. Compared to the conventional technique, in the invention, when the parallel resistance setting method is used, more resistance value setting intervals can be detected, such that the range of the applicable resistance values is expanded. On the other hand, the integrated circuit of the invention can implement setting of multiple function parameters at the same function pin, such that detection accuracy is maintained when the voltage-dividing setting method is executed, and it is avoided to sacrifice some resistance value setting intervals for the voltage-dividing setting method when the parallel setting method is executed, and both advantages of the two setting methods are achieved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

Moreover, any embodiment of or the claims of the invention is unnecessary to implement all advantages or features disclosed by the invention. Moreover, the abstract and the name of the invention are only used to assist patent searching, and are not used for limiting the claims of the invention.

What is claimed is:

1. An integrated circuit with function parameter setting, coupled to an external setting unit, the integrated circuit comprising:

a function pin, coupled to the external setting unit;

a switch unit, coupled to the function pin;

a first function adjustment circuit, coupled to the switch unit, and receiving a reference value, wherein the first function adjustment circuit comprises a first current source and a second current source respectively coupled to the switch unit, the first function adjustment circuit uses the first current source to detect a first voltage detecting value at the function pin, and compares the first voltage detecting value with a default value to generate a comparison result, and controls the switch unit to switch the first current source and the second current source according to the comparison result, and sets a first function parameter; and a second function adjustment circuit, coupled to the switch unit, and detecting a percentage of a divided voltage at the function pin, so as to provide the reference value and set a second function parameter.

2. The integrated circuit with function parameter setting as claimed in claim 1, wherein the first function adjustment circuit further comprises:

a control unit, generating the comparison result according to the first voltage detecting value and the default value, wherein when the comparison result indicates that the first voltage detecting value is smaller than the default value, the control unit controls the switch unit to turn on a path between the first current source and the external setting unit; and when the first voltage detecting value is greater than the default value, the control unit controls the switch unit to turn on a path between the second current source and the external setting unit.

3. The integrated circuit with function parameter setting as claimed in claim 2, wherein the first function adjustment circuit further comprises:

a first logic unit, having a plurality of comparators of a first group, wherein when the first voltage detecting value is smaller than the default value, the control unit activates the first logic unit, and the first logic unit determines a resistance value setting interval corresponding to the external setting unit according to the first voltage detecting value and the reference value and sets a first function parameter; and a second logic unit, having at least one comparator of a second group, wherein when the first voltage detecting value is greater than the default value, the control unit activates the second logic unit, and the first function adjustment circuit uses the second current source to detect a second voltage detecting value at the function pin, and the second logic unit determines the resistance value setting interval corresponding to the external setting unit according to the second voltage detecting value and the reference value and sets the first function parameter.

4. The integrated circuit with function parameter setting as claimed in claim 1, wherein a current value of the first current source is greater than a current value of the second current source.

5. The integrated circuit with function parameter setting as claimed in claim 1, wherein the switch unit turns off paths between the first current source and the second current source and the external setting unit, and the second function adjustment circuit sets the second function parameter.

6. A method with function parameter setting, adapted to an integrated circuit, wherein the integrated circuit has a function pin, and the function pin is coupled to an external setting unit and a switch unit, the method with function parameter setting comprising:

providing a first function adjustment circuit and a second function adjustment circuit respectively coupled to the switch unit, wherein the first function adjustment circuit comprises a first current source and a second current source;

using the second function adjustment circuit to detect a percentage of a divided voltage at the function pin, so as to provide a reference value to the first function adjustment circuit and set a second function parameter;

making the first current source to flow into or flow out of the external setting unit through the function pin;

using the first function adjustment circuit to detect a first voltage detecting value of the external setting unit;

generating a comparison result according to the first voltage detecting value and a default value; and controlling the switch unit to switch the first current source and the second current source according to the comparison result, and setting the first function parameter.

7. The method with function parameter setting as claimed in claim 6, further comprising:

controlling the switch unit to turn on a path between the first current source, the function pin and the external setting unit when the comparison result indicates that the first voltage detecting value is smaller than the default value; and controlling the switch unit to turn on a path between the second current source, the function pin and the external setting unit when the first voltage detecting value is greater than the default value.

8. The method with function parameter setting as claimed in claim 7, wherein the function adjustment circuit further comprises a first logic unit and a second logic unit, and the method with function parameter setting further comprises:

activating the first logic unit when the first voltage detecting value is smaller than the default value, wherein the first logic unit determines a resistance value setting interval corresponding to the external setting unit according to the first voltage detecting value and the reference value and sets the first function parameter; and activating the second logic unit when the first voltage detecting value is greater than the default value, making the second current source to flow into or flow out of the external setting unit through the function pin, and detecting a second voltage detecting value at the function pin, wherein the second logic unit determines the resistance value setting interval corresponding to the external setting unit according to the second voltage detecting value and the reference value and sets the first function parameter.

9. The method with function parameter setting as claimed in claim 7, wherein a current value of the first current source is greater than a current value of the second current source.

10. The method with function parameter setting as claimed in claim 6, wherein the switch unit turns off paths between the first current source and the second current source and the external setting unit, and the second function adjustment circuit sets the second function parameter.

* * * * *